United States Patent
Glazunov et al.

(10) Patent No.: US 10,483,454 B2
(45) Date of Patent: *Nov. 19, 2019

(54) PIEZOELECTRIC COMPONENT AND METHOD FOR PRODUCING A PIEZOELECTRIC COMPONENT

(71) Applicant: TDK Electronics AG, Munich (DE)

(72) Inventors: Alexander Glazunov, Deutschlandsberg (AT); Adalbert Feltz, Deutschlandsberg (AT)

(73) Assignee: TDK ELECTRONICS AG, München (DE)

( * ) Notice: Subject to any disclaimer, the term of this patent is extended or adjusted under 35 U.S.C. 154(b) by 374 days.

This patent is subject to a terminal disclaimer.

(21) Appl. No.: 15/361,436

(22) Filed: Nov. 27, 2016

(65) Prior Publication Data

US 2017/0141294 A1  May 18, 2017

Related U.S. Application Data

(62) Division of application No. 14/241,400, filed as application No. PCT/EP2012/064538 on Jul. 24, 2012, now Pat. No. 9,570,669.

(30) Foreign Application Priority Data

Aug. 30, 2011 (DE) .......... 10 2011 112 008

(51) Int. Cl.
*H01L 41/273* (2013.01)
*C04B 35/493* (2006.01)
(Continued)

(52) U.S. Cl.
CPC .......... *H01L 41/273* (2013.01); *C04B 35/491* (2013.01); *C04B 35/493* (2013.01);
(Continued)

(58) Field of Classification Search
CPC ... H01L 41/273; C04B 35/491; C04B 35/493; C04B 35/62222; C04B 35/6261;
(Continued)

(56) References Cited

U.S. PATENT DOCUMENTS 5,850,089 A * 12/1998 Varshney ................ C23C 14/08
257/295
7,579,756 B2  8/2009 Althoff et al.
(Continued)

FOREIGN PATENT DOCUMENTS

DE  102005061528 A1  7/2007
DE  102008042965 A1  4/2009
(Continued)

*Primary Examiner* — Livius R. Cazan
(74) *Attorney, Agent, or Firm* — Slater Matsil, LLP

(57) ABSTRACT

A method for producing a piezoelectric component is disclosed. In an embodiment, the method includes producing a ceramic precursor material of the general formula $Pb_{1-x-y-(2a-b)/2}V_{(2a-b)/2}''Ba_xSr_y[(Ti_zZr_{1-z})_{1-a-b}W_aRE_b]O_3$, where RE is a rare earth metal and V" is a Pb vacancy, mixing the ceramic precursor material with a sintering aid, forming a stack which includes alternating layers including the ceramic precursor material and a layer including Cu and debindering and sintering the stack thereby forming the piezoelectric component having Cu electrodes and at least one piezoelectric ceramic layer including $Pb_{1-x-y-[(2a-b)/2]-p/2}V_{[(2a-b)/2-p/2]}''Cu_pBa_xSr_y[(Ti_zZr_{1-z})_{1-a-b}W_aRE_b]O_3$, where $0 \leq x \leq 0.035$, $0 \leq y \leq 0.025$, $0.42 \leq z \leq 0.5$, $0.0045 \leq a \leq 0.009$, $0.009 \leq b \leq 0.011$, and $2a > b$, $p \leq 2a-b$.

20 Claims, 4 Drawing Sheets

(51) Int. Cl.
| | |
|---|---|
| *H01L 41/047* | (2006.01) |
| *H01L 41/187* | (2006.01) |
| *C04B 35/626* | (2006.01) |
| *C04B 35/638* | (2006.01) |
| *C04B 35/491* | (2006.01) |
| *C04B 35/622* | (2006.01) |
| *C04B 35/63* | (2006.01) |
| *C04B 35/64* | (2006.01) |
| *C04B 41/00* | (2006.01) |
| *C04B 41/51* | (2006.01) |
| *C04B 41/88* | (2006.01) |

(52) U.S. Cl.
CPC ...... *C04B 35/6261* (2013.01); *C04B 35/6262* (2013.01); *C04B 35/62222* (2013.01); *C04B 35/62645* (2013.01); *C04B 35/62685* (2013.01); *C04B 35/6303* (2013.01); *C04B 35/638* (2013.01); *C04B 35/64* (2013.01); *C04B 41/009* (2013.01); *C04B 41/5111* (2013.01); *C04B 41/88* (2013.01); *H01L 41/0471* (2013.01); *H01L 41/0477* (2013.01); *H01L 41/187* (2013.01); *H01L 41/1876* (2013.01); *C04B 2235/3213* (2013.01); *C04B 2235/3215* (2013.01); *C04B 2235/3224* (2013.01); *C04B 2235/3225* (2013.01); *C04B 2235/3236* (2013.01); *C04B 2235/3239* (2013.01); *C04B 2235/3249* (2013.01); *C04B 2235/3258* (2013.01); *C04B 2235/3281* (2013.01); *C04B 2235/3296* (2013.01); *C04B 2235/5445* (2013.01); *C04B 2235/656* (2013.01); *C04B 2235/658* (2013.01); *C04B 2235/6582* (2013.01); *C04B 2235/6584* (2013.01); *C04B 2235/6588* (2013.01); *C04B 2235/768* (2013.01); *C04B 2235/77* (2013.01); *C04B 2235/786* (2013.01); *C04B 2235/96* (2013.01); *Y10T 29/42* (2015.01)

(58) Field of Classification Search
CPC .......... C04B 35/6262; C04B 35/62645; C04B 35/62685; C04B 35/6303; C04B 35/638; C04B 35/64; C04B 41/009; C04B 41/5111; C04B 41/88; C04B 41/0471; C04B 41/0477; C04B 41/187; C04B 41/1876; Y10T 29/42
See application file for complete search history.

(56) References Cited

U.S. PATENT DOCUMENTS

| | | | |
|---|---|---|---|
| 7,855,488 | B2 | 12/2010 | Feltz et al. |
| 8,858,822 | B2 | 10/2014 | Feltz et al. |
| 9,570,669 | B2 * | 2/2017 | Glazunov ............. C04B 35/493 |
| 2006/0251911 | A1 * | 11/2006 | Feltz ..................... C04B 35/493 428/457 |
| 2008/0282536 | A1 * | 11/2008 | Bamiere ............... C04B 35/493 29/846 |
| 2011/0180198 | A1 * | 7/2011 | Aman ................. C04B 35/4682 156/89.12 |
| 2012/0306326 | A1 | 12/2012 | Schossmann et al. |

FOREIGN PATENT DOCUMENTS

| | | |
|---|---|---|
| EP | 1959510 A1 | 8/2008 |
| JP | H01157418 | 6/1989 |
| JP | 2002293625 | 10/2002 |
| JP | 2003529917 | 10/2003 |
| JP | 2006256925 | 9/2006 |
| JP | 2006265059 | 10/2006 |
| JP | 2007266469 | 10/2007 |
| JP | 2008137834 | 6/2008 |
| JP | 2008260674 | 10/2008 |
| WO | 0145138 A2 | 6/2001 |

* cited by examiner

PIEZOELECTRIC COMPONENT AND METHOD FOR PRODUCING A PIEZOELECTRIC COMPONENT

CROSS-REFERENCE TO RELATED APPLICATIONS

This patent application is a divisional of U.S. application Ser. No. 14/241,400, filed May 7, 2014 and issued as U.S. Pat. No. 9,570,669, which is a national phase filing under section 371 of PCT/EP2012/064538, filed Jul. 24, 2012, which claims the priority of German patent application 10 2011 112 008.8, filed Aug. 30, 2011, each of which is incorporated herein by reference in its entirety.

TECHNICAL FIELD

A piezoelectric component and a method for producing a piezoelectric component are specified.

BACKGROUND

Piezoelectric components such as piezoelectric multilayer components are used, for example, as actuators in fuel injection systems.

SUMMARY

At least one embodiment of the invention provides a piezoelectric component having improved properties. At least one further embodiment of the invention provides a method for producing a piezoelectric component having improved properties.

A piezoelectric component is specified that has at least one piezoelectric ceramic layer and at least one electrode adjacent the piezoelectric ceramic layer, the piezoelectric ceramic layer having a piezoelectric ceramic material of the general formula $Pb_{1-x-y-[(2a-b)/2]-p/2}V_{[(2a-b)/2-p/2]}"Cu_pBa_xSr_y[(Ti_zZr_{1-z})_{1-a-b}W_aRE_b]O_3$. In this formula $0 \leq x \leq 0.035$, $0 \leq y \leq 0.025$, $0.42 \leq z \leq 0.5$, $0.0045 \leq a \leq 0.009$, $0.009 \leq b \leq 0.011$, $2a > b$, $p \leq 2a-b$, RE is a rare earth metal, and V" is a Pb vacancy.

A component of this kind may have one electrode each, for example, on both sides of the piezoelectric ceramic layer. Alternatively the component may also be a multilayer component comprising at least two, preferably at least 100 piezoelectric ceramic layers. In this case the electrodes adjacent the piezoelectric ceramic layers are internal electrodes, with one internal electrode each being disposed between two ceramic layers. A multilayer component of this kind may additionally have opposing outer faces on each of which an external electrode is applied. The external electrodes are produced from the same material as the internal electrodes or have a different material from the internal electrodes. The internal electrodes are then divided into two groups, with one group of internal electrodes being contacted with one external electrode, and the other group of internal electrodes being contacted with the other external electrode.

The piezoelectric ceramic material is a ceramic based on lead zirconate titanate (PZT) of the general formula $ABO_3$ or $Pb(Zr_{1-z}Ti_z)O_3$, and therefore has a perovskite structure. PZT ceramics have what is called a morphotropic phase boundary of two coexisting ferroelectric phases, a tetragonal phase and a rhombohedral phase. This PZT ceramic is doped at its B sites with W as donor and with a rare earth metal RE as acceptor and, for $x>0$ and/or $y>0$, is doped at the A sites with Ba and/or Sr. The doping with Ba and/or Sr may result in a lowering of the Curie temperature of the ceramic material. W may be present in the VI oxidation state. Furthermore, at A sites, the ceramic material has Cu cations, which may be present in particular in the I oxidation state. In the ceramic material, during its production, the Cu acts as acceptor and, during sintering, produces temporary oxygen vacancies, leading to stable piezoelectric properties on the part of the piezoelectric component. Stable piezoelectric properties may be brought about, for example, by sufficiently dense piezoelectric ceramic materials (for example, ≥96% of the theoretical density) and by large grain growth (with an average grain size of, for example, ≥2 μm or ≥3 μm).

In multilayer components, advantageous piezoelectric properties may be dependent on the mobility of the displacement of ferroelectric domain walls in the PZT ceramic in an electrical field. The lower the density of the grain boundaries in the volume of the ceramic, or the greater the extent to which grain growth comes about up to an optimum average grain size in the sinter densification process, the less the restriction on the mobility. In PZT ceramics, grain growth may be promoted by the acceptor-induced formation of oxygen vacancies.

Furthermore, a combined donor-acceptor doping at the B sites, in other words doping with W and RE, may bring about an increase in the concentration of the vacancies V"', governed by the incorporation of RE acceptor centers. At the same time, during sintering, a correspondingly high concentration of oxygen vacancies, $V_O$, may be induced. With a doping concept of this kind, owing to the increased defect concentration, sufficient sinter densification of the piezoelectric ceramic may be achieved at temperatures of as low as about 950° C., and the grain growth that is essential for the development of advantageous piezoelectric properties may be considerably increased. The donor-acceptor ratio here may be set such as to produce a slight excess of vacancies at A sites in the finished ceramic. The oxygen vacancy concentration induced by RE centers during sintering is then no longer present in the finished ceramic.

Partial occupation of the vacancies may come about through Cu acceptors at the A sites, thereby further promoting grain growth.

In PZT ceramics there may be the following substitutions: $Pb^{II}$ at the A sites may be substituted by a cation of higher valence, this being referred to as a positive defect (since now a positive charge is localized more at the A site), thereby inducing the formation of a negatively charged defect (electron donor). Neutralization takes place either by formation of $Ti^{III}$ at a B site, or by formation of a vacancy at an adjacent Pb" or A site, as for example, V"'/2 (triple defect). Furthermore, Pb" at the A sites may be substituted by a cation of lower valence, this being referred to as a negative defect, since now a positive charge is localized less at the A site, thereby inducing the formation of a positively charged defect (electron acceptor). Neutralization takes place by formation of a vacancy at an oxygen site $V_O$", as for example, $V_O$"/2 (triple defect). $V_O$" may be occupied by ½ $O_2$, then forms 2 O and hence defect electron states in the oxygen valence band, with acceptor effect, which blocks harmful electron conduction.

$(Ti/Zr)^{IV}$ at the B sites may be substituted by a cation of higher valency, this being referred to as a defect, since now a positive charge is localized more at the B site, thereby inducing the formation of a negatively charged defect (electron donor). Neutralization takes place either by formation of $Ti^{III}$ at a B site or by formation of a vacancy at an adjacent Pb'' or A site, as for example, V'''/2 (triple defect). Furthermore, $(Ti/Zr)^{IV}$ may be substituted at the B sites by a cation of lower valency, this being referred to as a defect, since now a positive charge is localized less at the B site, thereby inducing the formation of a positively charged defect (electron acceptor). Neutralization takes place by formation of a vacancy at an oxygen site $V_O$'', as for example, $V_O$''/2 (triple defect). $V_O$'' may be occupied by ½ $O_2$, then forms 2 O and thus defect electron states in the oxygen valance band, with acceptor effect, and this blocks harmful electron conduction.

Through combined donor/acceptor doping it is equally possible to achieve neutralization, with donors or acceptors remaining according to which component is predominant.

The rare earth metal RE may be selected from a group which encompasses Lu, Yb, Tm, Er, Y, Ho, and Dy. According to one embodiment, the rear earth metal is Yb. It may be present in the III oxidation state in the abovementioned piezoelectric ceramic material.

The at least one electrode may comprise or consist of Cu. The component is therefore, for example, a piezoelectric multilayer component with Cu internal electrodes. The use of Cu electrodes or Cu internal electrodes is more cost effective by comparison with conventional electrodes, consisting, for example, of the noble metals Ag/Pd, and this is a factor particularly with multilayer components.

According to one embodiment, the piezoelectric ceramic material may be $Pb_{0.9451}V_{0.00128}''Cu_{0.003}Ba_{0.0295}Sr_{0.0211}[Ti_{0.467}Zr_{0.516}W_{0.00753}Yb_{0.0095}]O_3$. This ceramic material has a high density of, for example, 97.3% to 97.5% of the theoretical density, and a large grain size of 2 to 3 μm. The dielectric constant ε is 2100 and the coupling factor $k_p$ is 0.65. This ceramic material therefore has advantageous piezoelectric properties.

Further specified is a method for producing a piezoelectric component. The method comprises the method steps of A) producing a ceramic precursor material of the general formula $Pb_{1-x-y-(2a-b)/2}V_{(2a-b)/2}''Ba_xSr_y[(Ti_zZr_{1-z})_{1-a-b}W_aRE_b]O_3$, B) mixing the ceramic precursor material with a sintering aid, C) forming a stack which has in alternation a layer comprising the ceramic precursor material and a layer comprising Cu, D) debindering and sintering the stack, with formation of a component having Cu electrodes and at least one piezoelectric ceramic layer which comprises $Pb_{1-x-y-[(2a-b)/2]-p/2}V_{[(2a-b)/2-p/2]}''Cu_pBa_xSr_y[(Ti_zZr_{1-z})_{1-a-b}W_aRE_b]O_3$ where $0 \leq x \leq 0.035$, $0 \leq y \leq 0.025$, $0.42 \leq z \leq 0.5$, $0.0045 \leq a \leq 0.009$, $0.009 \leq b \leq 0.011$, $2a > b$, $p \leq 2a-b$, RE is a rare earth metal, and V''' is a Pb vacancy.

"In alternation" in relation to the stack formed in method step C) may also mean that a layer comprising Cu is not applied to each layer comprising ceramic precursor material. For example, certain layers comprising ceramic precursor material may be disposed one atop another, with no layers comprising Cu between them. The stack formed has at least one layer comprising the ceramic precursor material, and two layers comprising Cu, disposed on opposite sides of the layer. The term "stack" includes an arrangement of more than two, more particularly more than 100 layers comprising ceramic precursor material, with layers comprising Cu disposed between them. A stack of this kind is formed into a multilayer component having internal Cu electrodes in method step D).

With the method it is possible, for example, to produce a component according to the versions above. The "layer" in method step C) may comprehend compression moldings and films. From films it is possible, for example, to form a multilayer component.

The method therefore allows doping with W and a rare earth metal RE at the B sites of a PZT ceramic with perovskite structure, and also the incorporation of Cu acceptor centers at the A sites. The doping at the B sites already gives rise to high efficacy in the development of defects, and hence the contraction, i.e., the sinter densification, and an increased grain growth during sintering. Through the additional incorporation of the Cu acceptor centers it is also possible with the method, using inexpensive Cu electrodes, to produce components which feature high performance.

According to one embodiment, method step A) may have the following steps: A1) providing a mixture of starting materials which are selected from a group which encompasses $Pb_3O_4$, $TiO_2$, $ZrO_2$, $WO_3$, $RE_2O_3$, $BaCO_3$ and $SrCO_3$, A2) calcining the mixture at a first temperature and milling the mixture to a first average diameter, A3) calcining the mixture at a second temperature which is higher than the first temperature.

In method step A), therefore, by means of a mixed oxide method, a ceramic precursor material of the general formula $Pb_{1-x-y-(2a-b)/2}V_{(2a-b)/2}''Ba_xSr_y[(Ti_zZr_{1-z})_{1-a-b}W_aRE_b]O_3$ is produced, according to the desired stoichiometric composition, with the indices being selected from $0 \leq x \leq 0.035$, $0 \leq y \leq 0.025$, $0.42 \leq z \leq 0.5$, $0.0045 \leq a \leq 0.009$, $0.009 \leq b \leq 0.011$, and $2a > b$. $RE_2O_3$ may be, for example, $Yb_2O_3$, $Lu_2O_3$, $Tm_2O_3$, $Er_2O_3$, $Ho_2O_3$, $Dy_2O_3$ or $Y_2O_3$. Where $BaCO_3$ and/or $SrCO_3$ is also added to the mixture, it is possible thereby to achieve a lowering of the Curie temperature of the ceramic in the finished component.

In method steps A2) and A3), the oxide components can be reacted in two calcination steps with milling in between, leading to the formation of a PZT ceramic powder which is particularly homogeneous in relation to the formulation. In method step A2), the oxide components mixed in method step A1) can be reacted at a first temperature selected from the 850° C. to 925° C. range. The reaction may take place after the components, for example, have been mixed in an aqueous slip by means of $ZrO_2$ grinding media, the water has been removed by evaporation, and the mixture has been sieved. The duration of the reaction may be 2 hours, for example. The product obtained is subsequently milled to a first average diameter $d_{50}$, which may be selected to be smaller than 1 μm. For this purpose, the product may first be slurried in water.

In method step A3), the mixture obtained in method step A2) may be reacted a second time, at—for example—a second temperature, which may be selected from the 930° C. to 970° C. range. The duration of this reaction may be 2 hours, for example. For this purpose, the mixture obtained in method step A2) may first be evaporated down and sieved.

It is therefore possible in method step A) itself, in which a two-stage calcination with milling in between is carried out, to obtain a pulverulent ceramic precursor material having substantially uniform distribution of the components in the perovskite structure of the PZT ceramic.

According to one development, in method step B), PbO or $Pb_3O_4$ may be added as a sintering aid. $Pb_3O_4$ may undergo conversion on heating from as low as 500° C. into PbO, with elimination of oxygen. The fraction selected for the sintering aid may be between 0.5 and 3 mol %, more particularly between 0.5 and 2 mol %, based on 1 mol of ceramic precursor material. The actual sintering aid PbO may therefore be added in the form of $Pb_3O_4$ to the mixture obtained in method step A). From a temperature of about 890° C. onward, the added PbO forms a melt, as a result of which mechanisms of liquid phase sintering are manifested, which kinetically promote grain growth and contraction. Because the sintering aid is not added to the oxide mixture in method step A), but is only admixed after the synthesis of the property-bearing PZT ceramic precursor, the addition of the sintering aid is defined and controlled and hence the application of the sintering aid is improved. As a result, uncontrolled, partial elimination of PbO due to evaporation and reaction with firing aids during calcination can be avoided. The sintering aid is therefore able to be effective in the sinter densification process in line with the amount specifically employed.

Simultaneously with, before, or after the addition of the sintering aid, it is possible in method step B) for the mixture obtained in method step A) to be milled to a second average diameter which is smaller than the first average diameter. This may be an operation of fine milling, which may further promote the sintering activity. For this purpose, the mixture, in other words the reaction product from method step A), may be milled in an aqueous slurry or in a nonaqueous medium such as ethanol, using $ZrO_2$ beads having a diameter of ≤0.8 mm. The second average diameter $d_{50}$ may be selected from the range <0.4 µm, more particularly from the 0.3 µm to 0.35 µm range. As a result, a high specific surface energy can be obtained, and the resultant sintering activity can be utilized for the development of an optimum ceramic microstructure at about 1000° C. to 1050° C., more particularly at 1000° C. to 1010° C., in the presence of Cu electrodes. The combination of high specific surface energy and the donor-acceptor doping at the B sites may effectively activate the resulting driving force for sinter densification.

According to a further embodiment, in method step B), additionally, $Cu_2O$ may be added, with a fraction of 0.05 to 0.1 mol %, corresponding to the fraction p in the general formula. In this way, Cu acceptor centers can be generated in the PZT ceramic at the A sites, and these centers, during sintering, additionally induce oxygen vacancies and thereby promote sinter densification and grain growth. In this way it is also possible to promote the advantageous piezoelectric properties. The $Cu_2O$ can be added to the mixture which has already been finely milled to the second average diameter, or to a slip produced from the finely milled powder.

The finely divided powder obtained in method step B) may be converted into granules after a binder has been added. The granules can be used in turn to provide compression moldings in slice form or a slip for producing ceramic films. To produce a slip, an aqueous or nonaqueous dispersing medium, butyl acetate, for example, may be employed in combination with suitable dispersants and binders.

In method step C), furthermore, the layer comprising the ceramic precursor material may be sputter-coated with Cu or printed with a Cu paste. If the layer comprising the ceramic precursor material is a compression molding, it may be sputter-coated with Cu, for example. If the layer is a film, it may be printed with Cu paste, for example.

According to one development, in method step D), debindering may take place under steam with exclusion of oxygen. In this case, above about 400° C., the low oxygen partial pressure resulting from the thermal decomposition of steam may be lowered further by controlled supply of oxygen gas (forming gas). Debindering is carried out before sintering, in order to eliminate the organic constituents first of all. This may be carried out at temperatures of up to 550° C. In a process known as hydroreforming, with formation of $H_2$ and $CO_2$, the residual carbon content can be reduced to less than 300 ppm. Binders based on polyurethanes, for example, may be particularly suitable for debindering by means of steam in the absence of air, on the basis of their hydrolytic cleavage into monomers. The low residual carbon content after debindering reduces the risk of oxidation of Cu and/or the reduction of Pb by organic constituents.

The sintering in method step D) may take place at an oxygen partial pressure which lies between the equilibrium partial pressure of PbO/Pb and the equilibrium partial pressure of $Cu/Cu_2O$. In this case the oxygen partial pressure may be set by a mixture of steam and forming gas. Accordingly there is a steam-hydrogen atmosphere whose composition, for the processing window between the equilibrium oxygen partial pressure of PbO/Pb and that of $Cu/Cu_2O$, can be calculated from tabulated thermodynamic data as a function of the temperature, and leads, at 1000° C., for example, to an oxygen partial pressure of around $10^{-7}$. The setting of the oxygen partial pressure may therefore be set individually for the respective temperature. Which oxygen partial pressure can be employed at which temperature may be calculated from thermodynamic data and monitored by an oxygen probe.

Through the application of an oxygen partial pressure which is between the equilibrium partial pressure of PbO/Pb (or $PbTiO_3$/Pb,$TiO_2$) and the equilibrium partial pressure of $Cu/Cu_2O$, and which can be set temperature-dependently, it is possible to prevent oxidation of Cu to $Cu_2O$ and reduction of PbO to Pb and/or of $PbTiO_3$ to Pb and $TiO_2$. At the same time, $W^{VI}$ and $Yb^{III}$ may be redox-stable under such conditions, and therefore not subject to reduction. Accordingly, $W^{VI}$ and $Yb^{III}$ may indirectly become fully active as defects, in their function of promoting sinter densification and grain growth, as a result of temporary development of vacancies.

The sintering in method step D) may take place at a temperature selected from the 1000 to 1050° C. range, more particularly from the 1000 to 1010° C. range. For this purpose, the stack may be heated at a heating rate of about 3 K/min to 1000° C. to 1050° C., more particularly to 1010° C., and maintained for a number of hours, 3 hours for example. The cooling may take place more slowly than the heating.

As a result of the debindering and sintering being carried out under the aforementioned operating conditions, the ceramic precursor material which is sintered to give the doped PZT ceramic may take up minor amounts of Cu from the electrodes, present in the I oxidation state, at the vacancies of the A sites. "Minor amounts" may mean, for example, about 600 ppm, corresponding to 0.003 mol of Cu based on 1 mol of PZT ceramic. At the sintering temperature, these Cu acceptor centers additionally induce oxygen vacancies and thereby promote sinter densification and grain growth. This effect can be boosted by the abovementioned, optional addition of $Cu_2O$ in method step B).

It is possible accordingly to produce a piezoelectric ceramic which comprises $Pb_{1-x-y-[(2a-b)/2]-p/2}V''_{[(2a-b)/2-p/2]}Cu_pBa_xSr_y[(Ti_zZr_{1-z})_{1-a-b}W_aRE_b]O_3$ where the following is the case: where it is the case that $0 \leq x \leq 0.035$, $0 \leq y \leq 0.025$, $0.42 \leq z \leq 0.5$, $0.0045 \leq a \leq 0.009$, $0.009 \leq b \leq 0.011$, $2a > b$ and $p \leq 2a-b$.

With the method, therefore, a component featuring enhanced performance can be produced. This is accomplished through the incorporation of Cu acceptors and through the defined addition of a sintering aid for sinter densification and development of a sufficiently coarse grain microstructure with not very many grain boundaries in the volume of the ceramic. The driving force for sinter densification, resulting from the specific surface energy through fine milling and the donor-acceptor doping at B sites, may be effectively activated by mechanisms of liquid phase sintering, governed kinetically.

With the method it is possible, for example, to sinter stacks of several hundred ceramic layers with Cu electrodes disposed between them, these stacks being thereby densified and, in a subsequent step, singularized. In this way it is possible to produce actuators, for example.

According to one embodiment, in the method it is possible to select x=0.0295, y=0.0211, Z=0.475, a=0.00753, b=0.0095 and RE=Yb, and so in method step D) at least one piezoelectric ceramic layer comprising $Pb_{0.9451}V_{0.00128}"Cu_{0.003}Ba_{0.0295}Sr_{0.0211}[Ti_{0.467}Zr_{0.516}W_{0.00753}Yb_{0.0095}]O_3$ is produced. This ceramic material has enhanced piezoelectric properties, such as a high density, high deflection parameters, and a large average grain diameter.

Using light or electron microscopy and also radiography, the properties of the sintered compression moldings or films produced by the method can be characterized in terms of their density and their microstructure. The dielectric and piezoelectric properties can be determined by means of deflection and resonance measurements.

BRIEF DESCRIPTION OF THE DRAWINGS

Below, the specified component and the method, and their advantageous embodiments, are elucidated by means of figures, which are schematic and not true to scale, and also by a working example.

DETAILED DESCRIPTION OF ILLUSTRATIVE EMBODIMENTS

Figure 1:
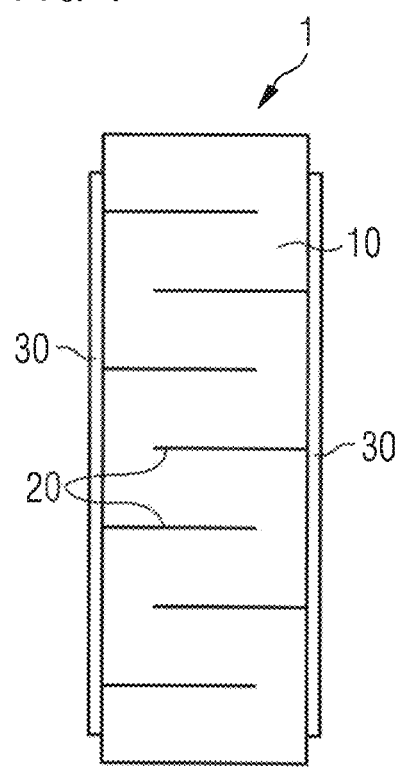
FIG. 1 shows the schematic side view of a piezoelectric component.

FIG. 1 shows a schematic side view of a piezoelectric component in the form of a multilayer component, as a piezoactuator. The component has a stack 1 of piezoelectric ceramic layers 10, disposed one atop another, with internal electrodes 20 between them. The internal electrodes 20 are designed as electrode layers. The piezoelectric ceramic layers 10 and the internal electrodes 20 are disposed one atop another.

In the embodiment shown here, the external electrodes 30 are disposed on opposite side faces of the stack 1, and run in stripe form along the stack direction. The external electrodes 30 comprise, for example, Ag or Cu and may be applied to the stack 1 as a metal paste, and baked.

The internal electrodes 20 run along the stack direction in alternation up to one of the external electrodes 30, with spacing from the second external electrode 30. In this way, the external electrodes 30 are electrically connected in alternation with the internal electrodes 20 along the stack direction. For producing the electrical connection, a connection element (not shown here) may be applied to the external electrodes 30, by soldering, for example.

The internal electrodes 20 are internal Cu electrodes. The piezoelectric ceramic layers comprise $Pb_{1-x-y-[(2a-b)/2]-p/2}V_{[(2a-b)/2-p/2]}"Cu_pBa_xSr_y[(Ti_zZr_{1-z})_{1-a-b}W_aRE_b]O_3$ material for which: $0 \leq x \leq 0.035$, $0 \leq y \leq 0.025$, $0.42 \leq z \leq 0.5$, $0.0045 \leq a \leq 0.009$, $0.009 \leq b \leq 0.0011$, $2a > b$, $p \leq 2a-b$, RE is a rare earth metal, and V" is a Pb vacancy. For example, the piezoelectric ceramic layers comprise the material $Pb_{0.9451}V_{0.00128}"Cu_{0.003}Ba_{0.0295}Sr_{0.0211}[Ti_{0.467}Zr_{0.516}W_{0.00753}Yb_{0.0095}]O_3$.

The aim of the working example below is to elucidate the production of the component comprising the material $Pb_{0.9451}V_{0.00128}"Cu_{0.003}Ba_{0.0295}Sr_{0.0211}[Ti_{0.467}Zr_{0.516}W_{0.00753}Yb_{0.0095}]O_3$.

In accordance with the general formula $Pb_{1-x-y-(2a-b)/2}V_{(2a-b)/2}"Ba_xSr_y[(Ti_zZr_{1-z})_{1-a-b}W_aRE_b]O_3$, the parameters x=0.0295, y=0.0211, z=0.475, a=0.00753, b=0.0095, and RE=Yb are selected, resulting in $Pb_{0.9466}V_{0.00278}"Ba_{0.295}Sr_{0.0211}[Ti_{0.467}Zr_{0.516}W_{0.00753}Yb_{0.0095}]O_3$. First of all, the raw materials $Pb_3O_4$, $TiO_2$, $ZrO_2$, $WO_3$, $Yb_2O_3$, $BaCO_3$, and $SrCO_3$, whose impurities content has been checked and whose metal content determined separately in each case, are weighed out in the corresponding molar ratio and subjected to rotary mixing with $ZrO_2$ grinding media in an aqueous slip for 24 hours (method step A1). Following evaporation and sieving, reaction takes place at 925° C., with a hold time of 2 hours, in a $ZrO_2$ capsule, and the reaction product is subjected to milling in an eccentric mill with addition of water, using $ZrO_2$ beads (diameter 2 mm) (method step A). At 300 cycl/min, a first average diameter $d_{50}$ of 0.66 μm (corresponding to $d_{90}$=1.64 μm) is obtained after just 30 minutes. The slip is evaporated down, the residue is passed through a sieve, and reaction takes place a second time, with a 2 h hold time at 950° C., in order to complete the reaction (method step A3).

Figure 3:
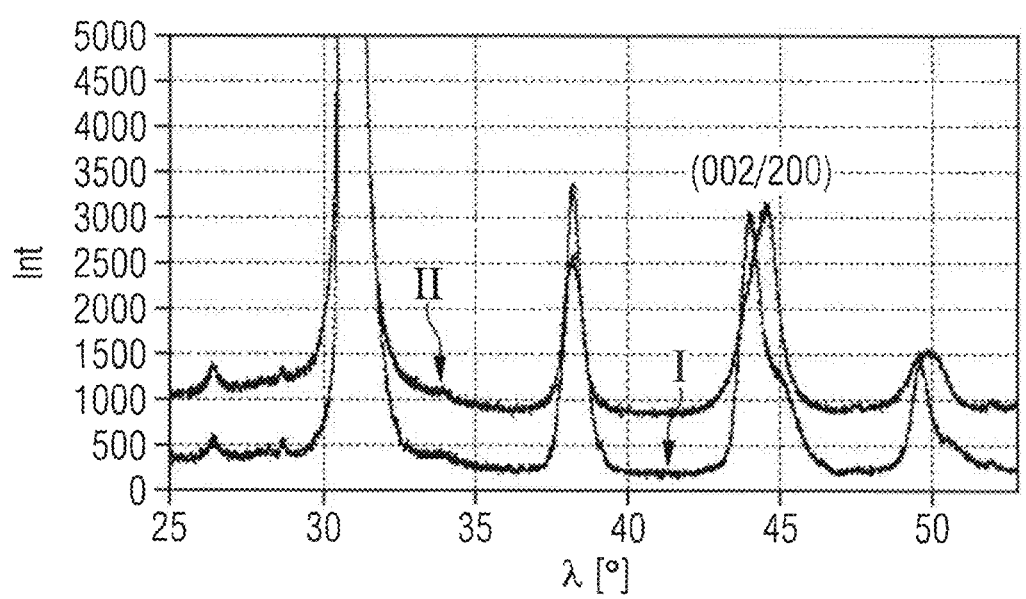
FIG. 3 shows a detail of an X-ray diffractogram.

FIG. 3 shows as a detail of an X-ray diffractogram, in which the angle λ in ° is plotted against the intensity Int, the comparison between the first and second calcination steps, in other words between the products after method step A2) and after method step A3). After the first reaction (plot I) there are still relatively Ti-rich tetragonal particles present alongside relatively Zr-rich rhombohedral crystallites, as evident from a splitting of the 200/002 reflection. After the second reaction (plot II), the splitting can no longer be resolved, evidencing the improved uniform distribution of Ti and Zr in the lattice of the PZT perovskite structure.

Following the addition of 2.5 mol % of PbO in the form of $Pb_3)O_4$, the reaction powder obtained at 950° C. is subjected to fine milling to 0.3 to 0.35 μm in an eccentric mill in water or ethanol, using $ZrO_2$ beads (diameter 0.8 mm) (method step B). This requires about 2 hours at 300 cycl/min. The dispersing medium is evaporated off, and the residue is passed through a sieve and, following addition of a PEG binder (polyethylene glycol), granules are prepared, from which slices with a diameter of 15.5 mm and a thickness of 1.4 to 1.5 mm are compression-molded.

Prior to sintering, these green bodies are provided with Cu electrodes by sputtering (method step C).

The compression moldings in slice form are first of all debindered by heating to 500° C. in air, and then sintered with a heating ramp of 6 K/min at 1000° C. and with a hold time of 3 h (method step D, comparative sample 1). Further compression moldings are sintered with the same debindering and heating ramp at 950° C. with a hold time of 4 h (comparison sample 2). Further compression moldings are sintered in an atmosphere with reduced oxygen partial pressure, set temperature-dependently through the ratio of steam to forming gas on heating at 3 K/min, with a hold time at 1010° C. of 4 h (working example).

Figure 2:
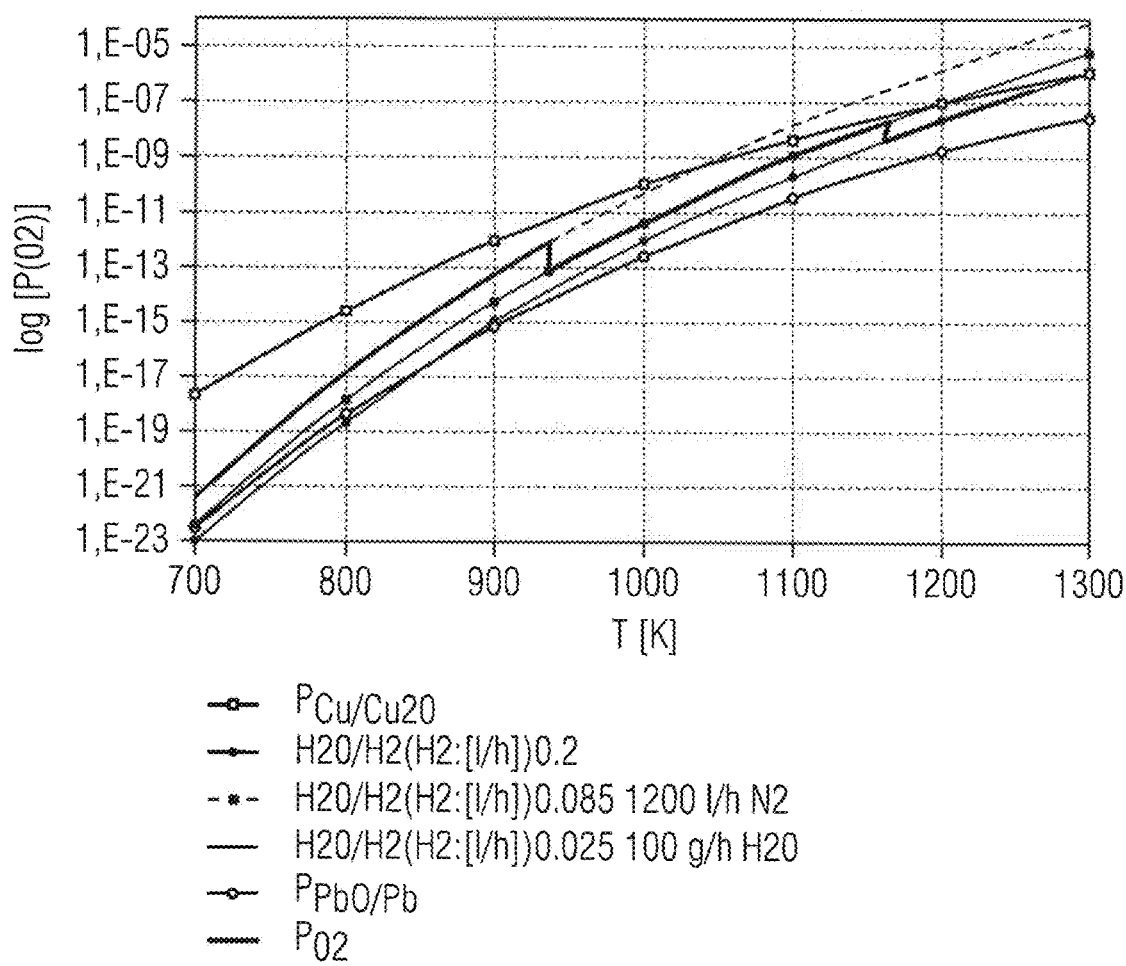
FIG. 2 shows partial pressures of differing systems.

FIG. 2 additionally shows different partial pressures according to which the appropriate oxygen partial pressure can be selected as a function of temperature. In the graph, the temperature T in K is plotted against the logarithmic oxygen partial pressure log ($p(O_2)$). The equilibrium partial pressure of the $Cu/Cu_2O$ system, $P_{Cu/Cu2O}$, and of the PbO/Pb system, $P_{PbO/Pb}$, are shown. The oxygen partial pressure $P_{O2}$ is allowed to vary between these equilibrium partial pressures if oxidation of Cu to $Cu_2O$ and reduction of PbO to Pb (or of $PbTiO_3$ to Pb and $TiO_2$) are to be avoided. FIG. 2 shows one possible profile of the oxygen partial pressure, which throughout the sintering operation lies between the equilibrium partial pressures $P_{Cu/Cu2O}$ and $P_{PbO/Pb}$. This profile has discontinuities at 940 K and at 1170 K. The discontinuities are situated between three lines, likewise shown in FIG. 2, which correspond to different amounts of forming gas (line with small dots, line with small squares, line with gaps). If the amounts of $N_2$ and of the $H_2O$ vapor remain constant, the oxygen partial pressure during sintering can be adjusted by adjusting the amount of forming gas.

Even under the defined operating conditions of the working example, sintering is accompanied by contamination of Cu from the electrodes, in the range of about 600 ppm. The Cu cations in the I oxidation state are incorporated as Cu acceptors, with elimination of an equivalent amount of 0.0015 mol of PbO, thus giving the following formula for the final composition of a piezoceramic produced under these conditions: $Pb_{0.9451}V_{0.00128}"Cu_{0.003}Ba_{0.0295}Sr_{0.0211}[Ti_{0.467}Zr_{0.516}W_{0.00753}Yb_{0.0095}]O_3$.

The sintered density of the samples in slice form is determined by weighing and ascertaining the geometric dimensions on five individual samples in each case, and the relative density $\rho_{rel}$ is calculated by comparison with the X-ray density of the PZT perovskite phase, at $\rho_{th}$=8.03 g/cm³. For the samples provided with 2.5 mol % of PbO as sintering aid, after sintering at 1000° C., a density $\rho$=7.83±0.04 g/cm³ is found, corresponding to 97.5% of the theoretical density, and even on sintering at 950° C. a comparable value $\rho$=8.81±0.04 g/cm³ is obtained, corresponding to 97.3% of the theoretical density. The sinter density obtained under defined operating conditions is 7.7 to 7.9 g/cm³. In the absence of addition of PbO in the form of $Pb_3O_4$, the value $\rho_{rel}$ found for the relative density of the sintering at 1000° C. is only 84.9%.

Accordingly, the free specific surface energy introduced by fine milling, and the formation of sinter-promoting defects induced by donor-acceptor doping at the B sites, are not sufficient to allow high sinter densification at just 1000° C. The addition of 2.5 mol % of PbO in the form of $Pb_3O_4$ as a sintering aid proves necessary in order to obtain a sufficiently dense piezoceramic.

Figure 4A:
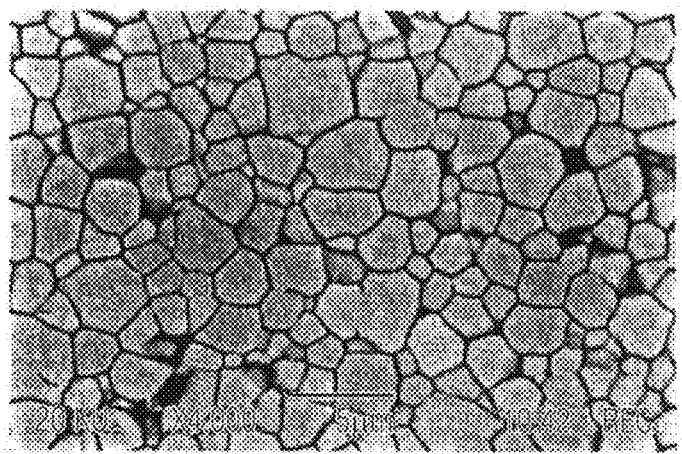
FIGS. 4a-4c show diagrams of grain microstructures in piezoelectric ceramics.
Figure 4B:
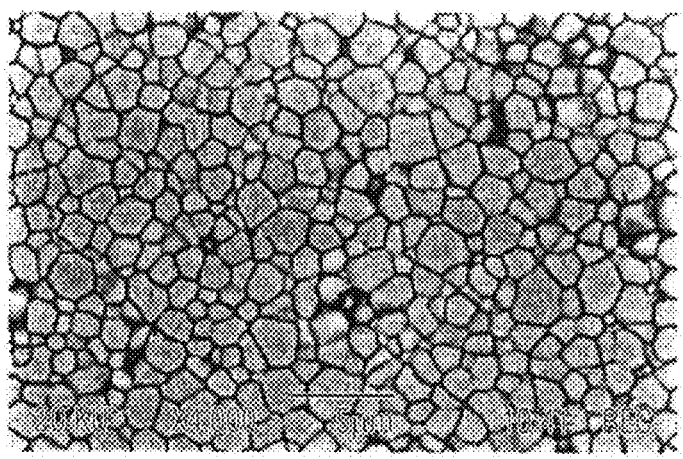
Figure 4C:
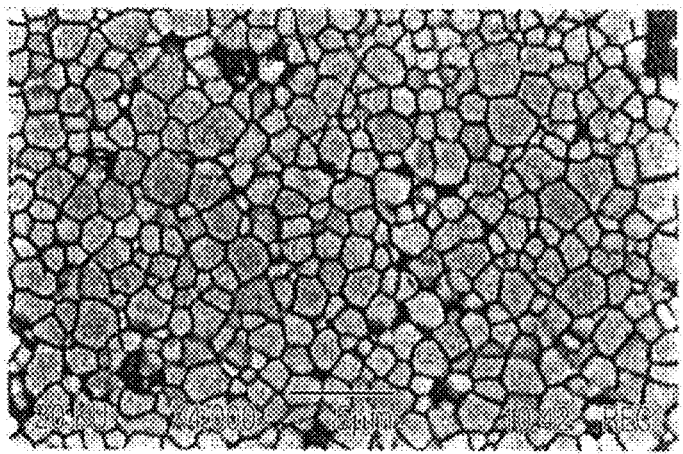

FIG. 4 shows diagrams of grain microstructures of piezoelectric ceramics. FIG. 4a) shows the microstructure obtained on sintering at 1010° C. when the oxygen partial pressure corresponds, on a temperature-dependent basis, during the hold time of 4 h, to the profile shown in FIG. 2. The effect of the as a result of the additional incorporation of the Cu acceptor centers on grain growth is clearly apparent. The average grain diameter is 2 to 3 µm. In contrast, the grain microstructures shown in FIGS. 4 b) and 4 c) for comparative samples 1 and 2 (sintering in air at 1000° C. for 3 h and sintering in air at 950° C. for 4 h, respectively) show smaller average grain diameters of 1 to 2.5 µm (FIG. 4b) and 0.5 to 2 µm (FIG. 4c).

Other characteristic variables of the compression molding according to the working example, provided with Cu electrodes, are indicated hereinafter: The deflection parameter $d_{33}$, which corresponds to the piezoelectric charge constant, can be defined by the relation $S_3=d_{33}*E_3$, with the relative extension S=Δl/l and the electric field strength E. The measurement performed after polarization at about 3 kV/mm gives a $d_{33}$ of 520 pm/V. From a measurement of capacity, the value found for the dielectric constant ε is 2100. For the planar coupling factor, the value $k_p$=0.65 was ascertained in accordance with the following relation:

$$k_p \cong \left[ 2.51 \frac{f_a - f_g}{f_a} - \left( \frac{f_a - f_g}{f_a} \right)^2 \right]^{1/2}.$$

The invention is not restricted by the description with reference to the working examples; instead, the invention encompasses every new feature and every combination of features, including more particularly every combination of features in the claims, even if this feature or this combination itself is not explicitly stated in the claims or working examples.

What is claimed is:

1. A method for producing a piezoelectric component, the method comprising:
   producing a ceramic precursor material of the general formula $Pb_{1-x-y-(2a-b)/2}V_{(2a-b)/2}"Ba_xSr_y[(Ti_zZr_{1-z})_{1-a-b}W_aRE_b]O_3$, where RE is a rare earth metal and V" is a Pb vacancy;
   mixing the ceramic precursor material with a sintering aid;
   forming a stack which includes alternating layers comprising the ceramic precursor material and a layer comprising Cu; and
   debindering and sintering the stack thereby forming the piezoelectric component having Cu electrodes and at least one piezoelectric ceramic layer comprising $Pb_{1-x-y-[(2a-b)/2]-p/2}V_{[(2a-b)/2-p/2]}"Cu_pBa_xSr_y[(Ti_zZr_{1-z})_{1-a-b}W_aRE_b]O_3$, where 0≤x≤0.035, 0≤y≤0.025, 0.42≤z≤0.5, 0.0045≤a≤0.009, 0.009≤b≤0.011, and 2a>b, p≤2a-b.

2. The method according to claim 1, wherein producing the ceramic precursor material comprises:
   providing a mixture of starting materials, the mixture of starting materials are selected from the group consisting of $Pb_3O_4$, $TiO_2$, $ZrO_2$, $WO_3$, $RE_2O_3$, $BaCO_3$ and $SrCO_3$;
   calcining the mixture at a first temperature and milling the mixture to a first average diameter; and
   calcining the mixture at a second temperature that is higher than the first temperature.

3. The method according to claim 2, wherein the mixture obtained by mixing the ceramic precursor material with the sintering aid is milled to a second average diameter that is smaller than the first average diameter.

4. The method according to claim 3, wherein the mixture obtained by mixing the ceramic precursor material with the sintering aid further comprises adding $Cu_2O$ with a fraction of 0.05 to 0.1 mol %.

5. The method according to claim 1, wherein mixing the ceramic precursor material comprises adding PbO or $Pb_3O_4$ as the sintering aid, a fraction selected for the sintering aid being between 0.5 and 3 mol %, based on 1 mol of ceramic precursor material.

6. The method according to claim 1, wherein forming the stack comprises applying Cu to the layer comprising the ceramic precursor material by sputter-coating with Cu or printing with a Cu paste.

7. The method according to claim 1, wherein debindering the stack takes place under steam with exclusion of oxygen.

8. The method according to claim 1, wherein sintering the stack takes place at an oxygen partial pressure which lies between an equilibrium partial pressure of PbO/Pb and an equilibrium partial pressure of $Cu/Cu_2O$.

9. The method according to claim 8, wherein the oxygen partial pressure is set by a mixture of steam and forming gas.

10. The method according to claim 1, wherein sintering takes place at a temperature between 1000° C. and 1050° C.

11. The method according to claim 1, wherein x=0.0295, y=0.0211, z=0.475, a=0.00753, b=0.0095, and RE=Yb are selected, and wherein debindering and sintering the stack comprises producing a piezoelectric ceramic layer comprising $Pb_{0.945}V''_{0.00128}Cu_{0.003}Ba_{0.0295}Sr_{0.0211}[Ti_{0.467}Zr_{0.516}W_{0.00753}Yb_{0.0095}]O_3$.

12. A method for producing a piezoelectric component, the method comprising:

providing a mixture of starting materials, the mixture of starting materials are selected from the group consisting of $Pb_3O_4$, $TiO_2$, $ZrO_2$, $WO_3$, $RE_2O_3$, $BaCO_3$ and $SrCO_3$;

calcining the mixture at a first temperature and milling the calcinated mixture to a first average diameter;

calcining the calcinated mixture at a second temperature that is higher than the first temperature and forming a green body;

forming a metal layer on the green body;

forming a stack of green bodies and metal layers;

debindering the stack; and sintering the stack thereby forming the piezoelectric component with piezoelectric ceramic layers comprising $Pb_{1-x-y-[(2a-b)/2]-p/2}V''_{[(2a-b)/2-p/2]}Cu_pBa_xSr_y[(Ti_zZr_{1-z})_{1-a-b}W_aRE_b]O_3$, where RE is a rare earth metal and V'' is a Pb vacancy, where $0 \leq x \leq 0.035$, $0 \leq y \leq 0.025$, $0.42 \leq z \leq 0.5$, $0.0045 \leq a \leq 0.009$, $0.009 \leq b \leq 0.011$, $2a>b$ and $p \leq 2a-b$.

13. The method according to claim 12, wherein forming the metal layer comprises sputtering the metal layer.

14. The method according to claim 12, wherein the metal layer comprises a Cu layer.

15. The method according to claim 12, further comprising mixing the mixture calcinated at the first temperature with a sintering aid.

16. The method according to claim 15, wherein mixing the mixture calcinated at the first temperature with the sintering aid comprises adding PbO or $Pb_3O_4$.

17. The method according to claim 15, further comprising milling a mixture obtained by mixing the mixture calcinated at the first temperature with the sintering aid to a second average diameter that is smaller than the first average diameter.

18. The method according to claim 12, wherein debindering the stack comprises steaming the stack with exclusion of oxygen.

19. The method according to claim 12, wherein sintering comprises heating the stack to a temperature between 1000° C. and 1050° C.

20. The method according to claim 12, wherein debindering and sintering the stack comprises producing the piezoelectric component comprising $Pb_{0.9451}V''_{0.00128}Cu_{0.003}Ba_{0.0295}Sr_{0.0211}[Ti_{0.467}Zr_{0.516}W_{0.00753}Yb_{0.0095}]O_3$.

* * * * *